United States Patent [19]

Saxena

[11] Patent Number: 5,781,562
[45] Date of Patent: Jul. 14, 1998

[54] METHOD, SYSTEM AND APPARATUS FOR EFFICIENTLY GENERATING BINARY NUMBERS FOR TESTING STORAGE DEVICES

[75] Inventor: Nirmal R. Saxena, San Jose, Calif.

[73] Assignee: Fujitsu Limited, Kawaski, Japan

[21] Appl. No.: 943,911

[22] Filed: Sep. 30, 1997

Related U.S. Application Data

[63] Continuation of Ser. No. 488,941, Jun. 9, 1995, abandoned.

[51] Int. Cl.⁶ .................................................. G01R 31/28
[52] U.S. Cl. .................................................. 371/27.1
[58] Field of Search ......................... 371/27.1, 27.2, 371/27.3, 27.4, 27.5, 27.6, 27.7, 21.1, 21.2, 21.3, 67.1, 71, 22.1, 22.5, 22.6

[56] References Cited

U.S. PATENT DOCUMENTS

| | | | |
|---|---|---|---|
| 4,322,812 | 3/1982 | Davis et al. | 395/436 |
| 4,493,046 | 1/1985 | Watanabe | 364/717 |
| 4,742,293 | 5/1988 | Koo et al. | 324/73 R |
| 4,789,821 | 12/1988 | Baschiera et al. | 324/73 R |
| 5,155,732 | 10/1992 | Jarwala et al. | 371/22.3 |
| 5,159,599 | 10/1992 | Steele et al. | 371/22.2 |
| 5,228,045 | 7/1993 | Chiles | 371/22.3 |
| 5,258,986 | 11/1993 | Zerbe | 371/21.2 |
| 5,383,195 | 1/1995 | Spence et al. | 371/22.5 |
| 5,412,665 | 5/1995 | Gruodis et al. | 371/27 |
| 5,444,716 | 8/1995 | Jarwala et al. | 371/22.3 |
| 5,446,741 | 8/1995 | Boldt et al. | 371/21.1 |
| 5,469,445 | 11/1995 | Nicolaidis | 371/22.3 |

FOREIGN PATENT DOCUMENTS

WO89/09471  10/1989  WIPO.

OTHER PUBLICATIONS

Archambeau, Eric & Van Egmond, Ken, "Built–In Test Compiler in an ASIC Environment", *Proceedings of the International Test Conference (New Frontiers in Testing)*, Sep. 12, 13, 14, 1988, Washington, D.C., Paper 32.2, pp. 657–664.

*Primary Examiner*—Ho T. Nguyen
*Attorney, Agent, or Firm*—Fenwick & West LLP

[57] ABSTRACT

An apparatus generates patterns useful for testing storage devices using a modified form of a shift register. A control input and two bits are added and the least significant bit of the result is substituted in place of one of the bits which are rotatably shifted to generate subsequent patterns. The patterns generated may be used to test storage devices by writing the pattern to the storage device, reading the device and comparing the pattern read with the pattern written. A difference indicates a storage device error.

14 Claims, 6 Drawing Sheets

| System Control Input = 0 | |
|---|---|
| Cycle | Output |
| 0 | 1000  ⌐410 |
| 1 | 0100 |
| 2 | 0010 |
| 3 | 0001 |
| 4 | 1100 |
| 5 | 0110 |
| 6 | 0011 |
| 7 | 1101 |
| 8 | 1010 |
| 9 | 0101 |
| 10 | 1110 |
| 11 | 0011 |
| 12 | 1111 |
| 13 | 1011 |
| 14 | 1001  ⌐414 |
| 15 | 1000  ⌐416 |

*Figure 4A*

| System Control Input = 1 | |
|---|---|
| Cycle | Output |
| 0 | 0111  ⌐450 |
| 1 | 1011 |
| 2 | 1101 |
| 3 | 1110 |
| 4 | 0011 |
| 5 | 1001 |
| 6 | 1100 |
| 7 | 0010 |
| 8 | 0101 |
| 9 | 1010 |
| 10 | 0001 |
| 11 | 1000 |
| 12 | 0000 |
| 13 | 0100 |
| 14 | 0110  ⌐454 |
| 15 | 0111  ⌐456 |

*Figure 4B*

METHOD, SYSTEM AND APPARATUS FOR EFFICIENTLY GENERATING BINARY NUMBERS FOR TESTING STORAGE DEVICES

RELATED APPLICATIONS

This is a continuation of application Ser. No. 08/488,941 filed on Jun. 9, 1995, now abandoned.

FIELD OF THE INVENTION

The present invention relates to microprocessor designs and more specifically to self-test capabilities of a microprocessor.

RELATED APPLICATIONS

The subject matter of this application is related to the following applications:

application Ser. No. 08/488,816 entitled "Method, System and Apparatus for Detecting Duplicate Entries in a Look-Up Table" filed on Jun. 9, 1995 by Nirmal R. Saxena;

application Ser. No. 08/488,615 entitled "Method and Apparatus for Detecting Memory Addressing Errors" filed on Jun. 9, 1995 by Nirmal R. Saxena;

application Ser. No. 08/457,049 entitled "METHOD AND APPARATUS FOR ROTATING ACTIVE INSTRUCTIONS IN A PARALLEL DATA PROCESSOR" filed on Jun. 1, 1995 by Sunil Savkar, Michael C. Shebanow, Gene W. Shen, and Farnad Sajjadian;

application Ser. No. 08/456,746 entitled "PROGRAMMABLE INSTRUCTION TRAP SYSTEM AND METHOD" filed on Jun. 1, 1995 by Sunil Savkar, Gene W. Shen, Farnad Sajjadian, and Michael C. Shebanow;

application Ser. No. 08/388,602 entitled "INSTRUCTION FLOW CONTROL CIRCUIT FOR SUPERSCALER MICROPROCESSOR" filed on Feb. 14, 1995 by Takeshi Kitahara;

application Ser. No. 08/388,389 entitled "ADDRESSING METHOD FOR EXECUTING LOAD INSTRUCTIONS OUT OF ORDER WITH RESPECT TO STORE INSTRUCTIONS" filed on Feb. 14, 1995 by Michael A. Simone and Michael C. Shebanow;

application Ser. No. 08/388,606 entitled "METHOD AND APPARATUS FOR EFFICIENTLY WRITING RESULTS TO RENAMED REGISTERS" filed on Feb. 14, 1995 by DeForest W. Tovey, Michael C. Shebanow and John Gmuender;

application Ser. No. 08/388,364 entitled "METHOD AND APPARATUS FOR COORDINATING THE USE OF PHYSICAL REGISTERS IN A MICROPROCESSOR" filed on Feb. 14, 1995 by DeForest W. Tovey, Michael C. Shebanow and John Gmuender;

application Ser. No. 08/390,885 entitled "PROCESSOR STRUCTURE AND METHOD FOR TRACKING INSTRUCTION STATUS TO MAINTAIN PRECISE STATE" filed on Feb. 14, 1995 by Gene W. Shen, John Szeto, Niteen A. Patkar and Michael C. Shebanow;

application Ser. No. 08/397,810 entitled "PARALLEL ACCESS MICRO-TLB TO SPEED UP ADDRESS TRANSLATION" filed on Mar. 3, 1995 by Chih-Wei David Chang, Kioumars Dawallu, Joel F. Boney, Ming-Ying Li and Jen-Hong Charles Chen;

application Ser. No. 08/397,809 entitled "LOOKASIDE BUFFER FOR ADDRESS TRANSLATION IN A COMPUTER SYSTEM" filed on Mar. 3, 1995 by Leon Kuo-Liang Peng, Yolin Lih and Chih-Wei David Chang;

application Ser. No. 08/397,893 entitled "RECLAMATION OF PROCESSOR RESOURCES IN A DATA PROCESSOR" filed on Mar. 3, 1995 by Michael C. Shebanow, Gene W. Shen, Ravi Swami, Niteen Patkar;

application Ser. No. 08/397,891 entitled "METHOD AND APPARATUS FOR SELECTING INSTRUCTIONS FROM ONES READY TO EXECUTE" filed on Mar. 3, 1995 by Michael C. Shebanow, John Gmuender, Michael A. Simone, John R. F. S. Szeto, Takumi Maruyama and DeForest W. Tovey;

application Ser. No. 08/397,911 entitled "HARDWARE SUPPORT FOR FAST SOFTWARE EMULATION OF UNIMPLEMENTED INSTRUCTIONS" filed on Mar. 3, 1995 by Shalesh Thusoo, Farnad Sajjadian, Jaspal Kohli, and Niteen Patkar;

application Ser. No. 08/398,284 entitled "METHOD AND APPARATUS FOR ACCELERATING CONTROL TRANSFER RETURNS" filed on Mar. 3, 1995 by Akiro Katsuno, Sunil Savkar and Michael C. Shebanow;

application Ser. No. 08/398,066 entitled "METHODS FOR UPDATING FETCH PROGRAM COUNTER" filed on Mar. 3, 1995 by Akira Katsuno, Niteen A. Patkar, Sunil Savkar and Michael C. Shebanow;

application Ser. No. 08/397,910 entitled "METHOD AND APPARATUS FOR PRIORITIZING AND HANDLING ERRORS IN A COMPUTER SYSTEM" filed on Mar. 3, 1995 by Chih-Wei David Chang, Joel Fredrick Boney and Jaspal Kohli;

application Ser. No. 08/398,151 entitled "METHOD AND APPARATUS FOR RAPID EXECUTION OF CONTROL TRANSFER INSTRUCTIONS" filed on Mar. 3, 1995 by Sunil W. Savkar;

application Ser. No. 08/397,800 entitled "METHOD AND APPARATUS FOR GENERATING A ZERO BIT STATUS FLAG IN A MICROPROCESSOR" filed on Mar. 3, 1995 by Michael Simone;

application Ser. No. 08/397,912 entitled "ECC PROTECTED MEMORY ORGANIZATION WITH PIPELINED READ-MODIFY-WRITE ACCESS" filed on Mar. 3, 1995 by Chien Chen and Yizhi Lu; and application Ser. No. 08/398,299 entitled "PROCESSOR STRUCTURE AND METHOD FOR TRACKING INSTRUCTION STATUS TO MAINTAIN PRECISE STATE" filed on Mar. 3, 1995 by Chien Chen, John R. F. S. Szeto, Niteen A. Patkar, Michael C. Shebanow, Hideki Osone, Takumi Maruyama and Michael A. Simone;

each of the above applications are incorporated herein by reference in their entirety.

BACKGROUND OF THE INVENTION

Many integrated circuits including microprocessors contain circuitry which tests the functional circuitry of the integrated circuit. Integrated circuits which store bits as a word present special testing problems. Such integrated circuits include storage circuits such as random access memory, and microprocessors which often contain both memory and register circuitry.

One problem associated with storage circuitry is a tendency for the storage circuitry to remember the wrong bit value after a new bit value is written to it. This problem, known as a "fault," may be due to a bit "stuck at" a particular value or due to interference from one or more adjacent bits which may occur when the adjacent bit or bits are set to one or more particular patterns. It is therefore desirable to test the storage circuitry in an integrated circuit by writing multiple combinations of bits into the circuitry, and then reading the circuitry to ensure that the new value was properly stored.

Sometimes the fault in the circuitry is particularly difficult to detect. Where the circuitry receives the patterns A then B then C, the fault may not present itself, however the pattern C then B then A can cause the fault to appear. Thus, circuitry which always writes a predetermined sequence of only the possible patterns may not allow for the detection of all possible faults. It is therefore desirable to generate patterns in a variety of sequences.

One approach utilizes a right rotatable shift register with a feedback allowing the least significant bit to shift into both the most significant bit and also to one input of a two-input Exclusive-OR gate. The other input of the Exclusive-OR gate receives the shifted most significant bit, and the output of the Exclusive-OR gate is shifted into the second most significant bit position. The remaining bits shift one position to the right in the fashion of conventional shift registers. This apparatus produces a single sequence of $2^n-1$ patterns using the bits in the shift register as the outputs where n is the number of bits in the shift register. However, this approach generates only a single sequence of patterns, which is undesirable for the reasons described above.

Another approach adds a selectable inverter stage to the output of the shift register described above. The selectable inverter stage is made of n Exclusive-OR gates. Each of the additional Exclusive-OR gates in the selectable inverter stage has one input coupled to one of the outputs of the shift register described above. All of the other inputs of each Exclusive-OR gate in the selectable inverter are coupled together, and coupled to a control input. When the control input is held low, the output of each Exclusive-OR gate is the same as the output of the shift register described above. When the control input is held high, the output of each Exclusive-OR gate is the inverse of the output of the shift register described above, allowing the generation of a second pattern.

Because the circuitry in a given size integrated circuit replaces the functional circuitry, it is desirable that the pattern-generation circuitry be as compact as possible. Because the pattern-generation circuitry may interfere with the operation of the functional circuitry, it is desirable that the pattern-generation circuitry be as efficient as possible.

SUMMARY OF INVENTION

In accordance with the present invention, an apparatus generates multiple sequences of patterns useful for testing faults by using a modified form of a shift register. The patterns are generated by replacing one of the bits in the register with the low order bit from a sum of two of the bits in the shift register and an input. The input is used to control the pattern generated. A system and method test for faults by generating the pattern using a modified shift register, writing the pattern to the storage device, reading the storage device, and comparing the pattern read with the pattern generated. The use of a modified shift register without the additional selectable inverter stage described above makes the device space efficient and fast to operate.

BRIEF DESCRIPTION OF THE DRAWINGS

FIGS. 4A and 4B are tables showing the values produced for two different values of the system control input of the apparatus of FIG. 3.

DETAILED DESCRIPTION OF A PREFERRED EMBODIMENT

Shift registers may be adapted to generate patterns to test for storage device faults. Patterns generated by such a modified shift register may be generated and written into the storage device. The storage device may be read, and the pattern stored therein compared with the expected pattern to test for storage device faults.

Conventional shift registers are used to shift the bits in a word one or more positions to the left or to the right. Some shift registers rotate the bits, treating the bits in the word as being arranged in a circle, with no end positions. Other shift registers drop the most significant bit and insert a particular value into the least significant bit or vice-versa. Some shift registers can perform more than one of these functions, shifting left or right and either rotating the bit which "drops off" into a new position, or inserting a particular value into this new position.

Figure 1A:
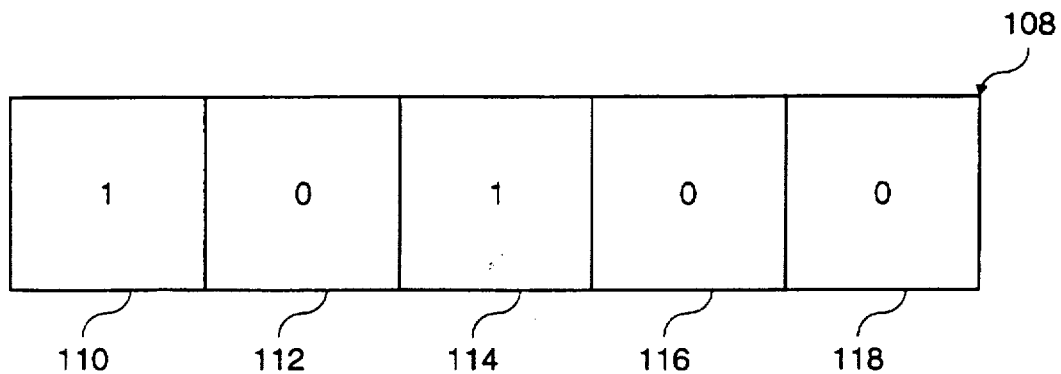
FIGS. 1A and 1B are block diagrams illustrating the operation of a conventional shift register which rotates the most significant bit into the least significant bit position.
Figure 1B:
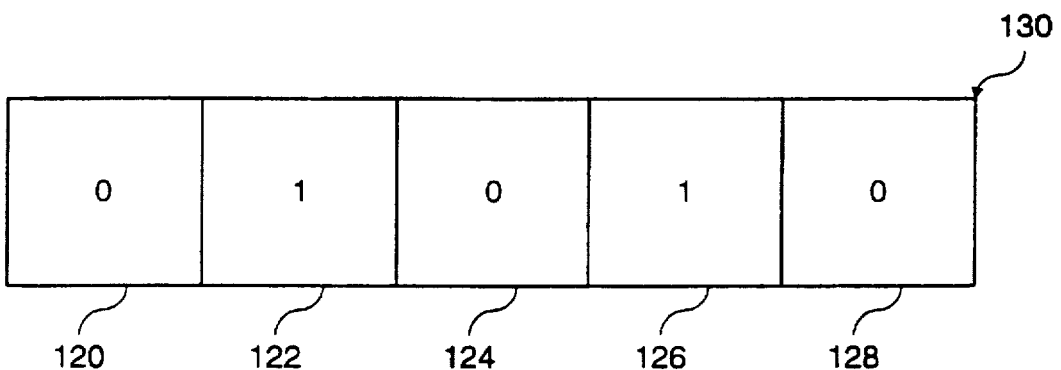

Referring now to FIGS. 1A and 1B, the operation of a four-bit, rotating shift register 108 is illustrated. FIG. 1A illustrates the starting positions of bits 110, 112, 114, 116, 118 in the register 108. FIG. 1B illustrates the bits 120, 122, 124, 126, 128 in shift register 130 corresponding to bits 110, 112, 114, 116, 118 respectively in shift register 108 after the bits have been shifted one position to the right. Bits in positions 110, 112, 114 and 116 in FIG. 1A have been shifted to bit positions 122, 124, 126, 128 respectively. The least significant bit 118 in FIG. 1A has been rotated into the most significant bit 120 in FIG. 1B.

Figure 2:
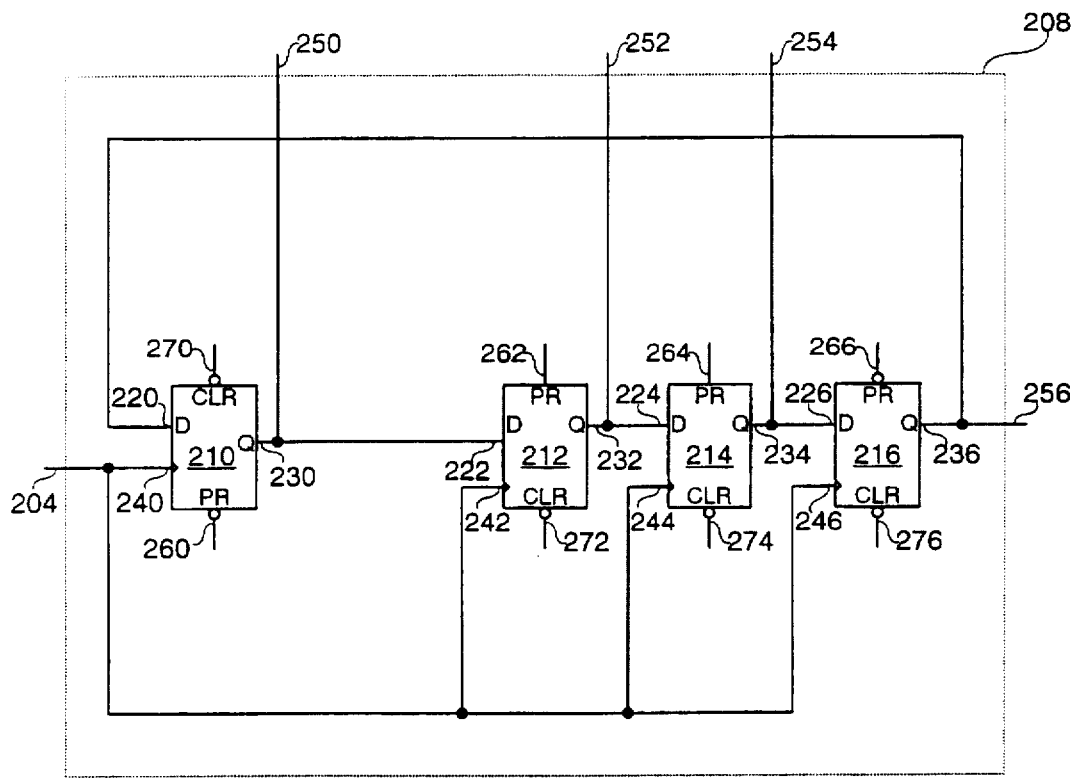
FIG. 2 is a block schematic diagram of a conventional shift register which rotates the most significant bit into the least significant bit position.

Referring now to FIG. 2, an apparatus 208 which operates as a conventional shift register is shown. Four data latches 210, 212, 214, 216 are arranged as a shift register 208 which rotates the output 256, representing least significant bit, into the output 250, representing the most significant bit, at the next clock cycle. Although data latches 210, 212, 214, 216 are shown, any type of storage latch may be used. Latch outputs 230, 232, 234, are coupled to the next most significant bit latch input 222, 224, 226. The latch output 236 from the least significant latch 216 is coupled to latch input 220 of most significant latch 210. Clock inputs 240, 242, 244, 246 are connected together and driven by the same clock input 204.

As described below, a rotating shift register 208 may be modified to efficiently produce two sequences of binary numbers in which each sequence contains all but one binary number, and each sequence is the ones-complement of the other. A control input may be provided to select the sequence desired, and the sequence may be started at one or more positions by pre-loading the modified rotating shift register.

Figure 3:
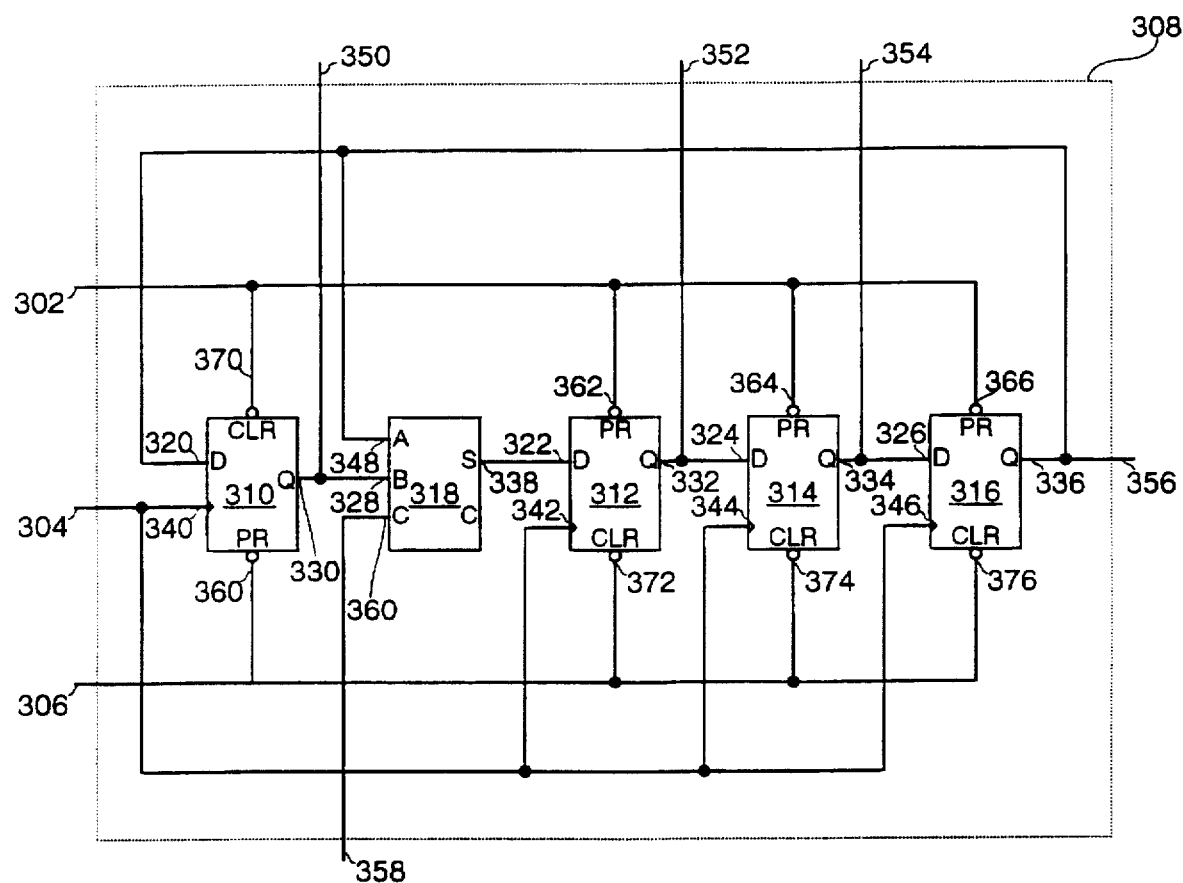
FIG. 3 is a block schematic diagram of an apparatus for generating patterns according to the present invention.

Referring now to FIGS. 2 and 3, the rotating shift register 208 of FIG. 2 is modified to produce one embodiment of the apparatus 308 of the present invention as shown in FIG. 3. A four-bit modified rotating shift register is shown, however any number of bits greater than one may be used. The latches 310, 312, 314, 316 are interconnected in the same manner as shown in FIG. 2 and described above, with the exception of the addition of an adder inserted between output 330 of the most significant latch 310, and input 322 of the next most significant latch 312. Any type of latch or adder may be used. In one embodiment, adder 318 is a three input Exclusive-OR gate which has an output high if an odd number of inputs are high and an output low otherwise. In another embodiment, adder 318 is a conventional three-input adder with the carry output unused. Most significant latch output 330 is coupled to one of the inputs 328 of adder 318. A second input 348 of adder 318 is coupled to receive the output 336 of least significant latch 316. A third input 360 of adder 318 is coupled to a system control input 358 to be used as described below.

The number and position of adder 318 is a function of the desired number of bits in the pattern. The coefficients of primitive polynomials c(0), c(1), c(2), c(3) map to the latches 310, 312, 314, 316 and when the coefficient is equal to 1, adder 318 is inserted between the output of the corresponding latch and the input of the next least significant latch following the corresponding latch. Each such adder accepts the output of the corresponding latch, the output of least significant latch 316 and the system control input 358. Coefficients of primitive polynomials are described in W. W. Peterson and E. J. Weldon Jr., *Error—Correcting Codes*, (2d ed. MIT Press, 1984). Table 1 lists the positions of the adders among latches 1 to n for up to 32 bits in the pattern.

TABLE 1

| Bits in Pattern | Adder Inserted After Latch(es) |
| --- | --- |
| 1, 2, 3, 4, 6, 7, 15 or 22 | 1 |
| 5, 11, 21, 29 | 2 |
| 10, 17, 20, 25, 28, 31 | 3 |
| 9 | 4 |
| 23 | 5 |
| 18 | 7 |
| 8 | 2, 3 and 4 |
| 12 | 1, 4 and 6 |
| 13 | 1, 3 and 4 |
| 14 or 16 | 3, 4 and 5 |
| 19 or 27 | 1, 2 and 5 |
| 24 | 1, 2 and 7 |
| 26 | 1, 2, and 6 |
| 30 | 1, 2 and 23 |
| 32 | 1, 2 and 22 |

FIG. 3 illustrates a four bit pattern and as indicated in Table 1, a single adder 318 is inserted between the output of latch 1 310 and the input of next least significant latch 312.

The latches 310, 312, 314, 316 may be preloaded to a starting pattern. In one embodiment, input 302 may be held low to pre-load a value of "0" in most significant latch 310 and a value "1" in remaining latches 312, 314, 316. System input 306 may be used to pre-load a "1" in most significant latch 310 and a "0" in remaining latches 312, 314, 316. After a value is pre-loaded into the latches 310, 312, 314, 316, system control input 358 is held either high or low while the clock 304 digitally oscillates between 1 and 0 to produce a desired sequence.

Referring now FIGS. 3 and 4A, FIG. 4A shows the value of outputs 350, 352, 354, 356 at each successive clock cycle in which input 302 is momentarily held low at clock cycle 0 410 and system control input 358 is held low throughout the sequence. Referring now to FIGS. 3 and 4B, FIG. 4B shows the outputs 350, 352, 354, 356 when system control input 358 is held high throughout the sequence and input 306 is momentarily held low at clock cycle 0 450.

Referring now to FIGS. 4A and 4B fifteen of the sixteen possible bit patterns are generated. Because the final patterns 414 and 454 generated at cycle 14 equal the initial patterns 410, 450 at cycle 0 the sequence repeats at cycle 15 416, 456.

Because the sequence repeats, the present invention allows any pattern to be the "start" of the sequence, except the "missing patterns" in which all bits equal the system control input, 0000 in FIG. 4A, 1111 in FIG. 4B.

One or more patterns may be written to a conventional storage device, read back and compared with the pattern written to determine if the storage device is susceptible to faults.

Figure 5:
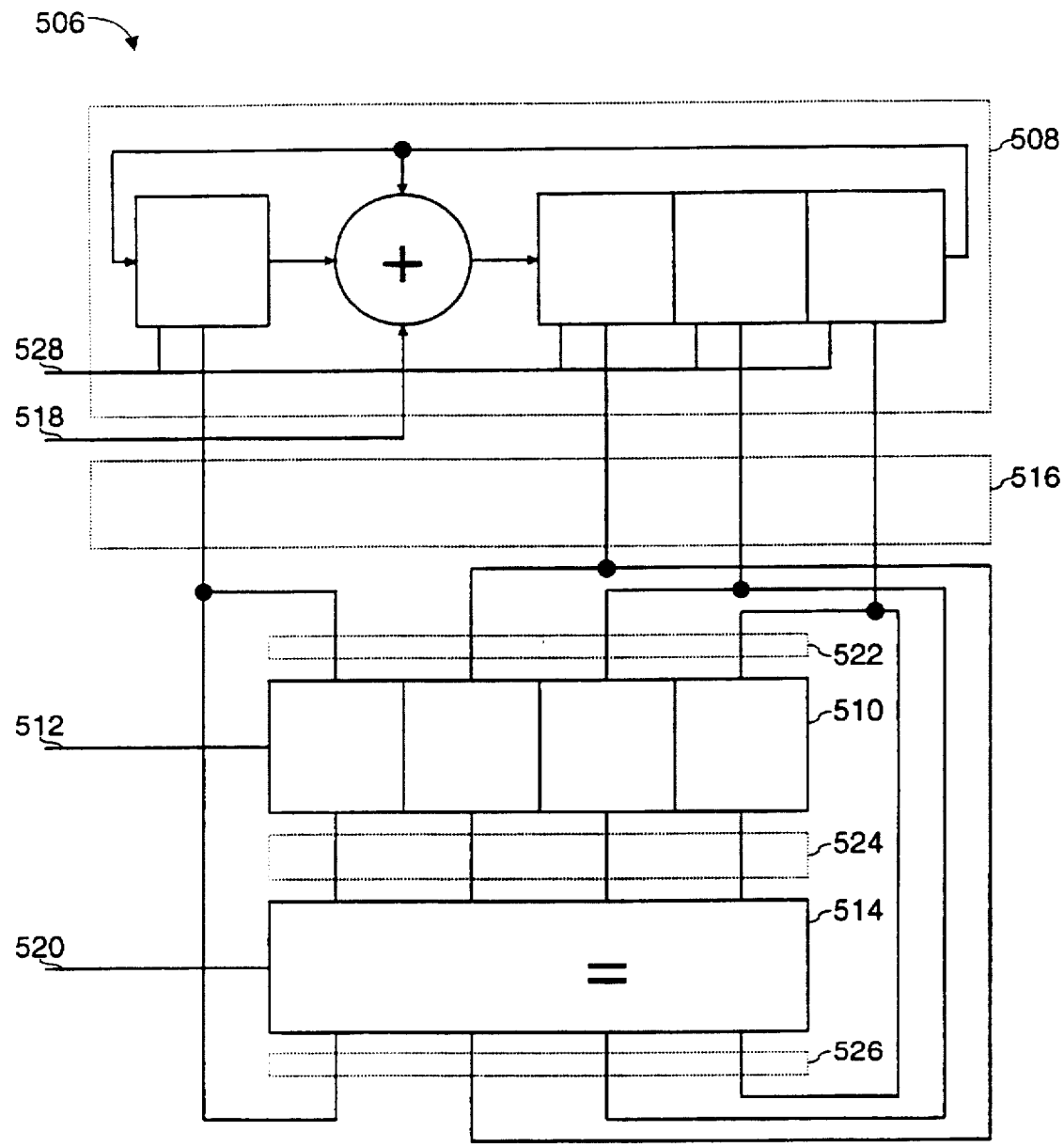
FIG. 5 is a block schematic diagram of an apparatus which tests a storage device according to the present invention.

Referring now to FIG. 5, a system 506 for testing a storage device 510 is shown. By providing a starting sequence as described above, the pattern-generation apparatus 508 of the modified rotating shift register described above generates patterns on bit lines 516 coupled to inputs 522 of storage device 510 for storage when read/write input 512 is asserted for writing. When read/write input 512 is asserted for reading, the stored bits are driven onto output lines 524 which are coupled to inputs of equality detector 514 which asserts an output line 520 when inputs 526 are bitwise not equal to inputs 524. If the read/write input 512 is asserted for reading while the bit lines 516 are still valid, the result is to test whether the storage device 510 stored what was written into it. If read/write input 512 digitally oscillates at the same frequency as the clock 528, the storage device 510 is tested for various patterns if the system control input is held at a particular value. The test may be repeated with a system control input 518 of the opposite value to generate another set of patterns with which to test the storage device 510.

Figure 6:
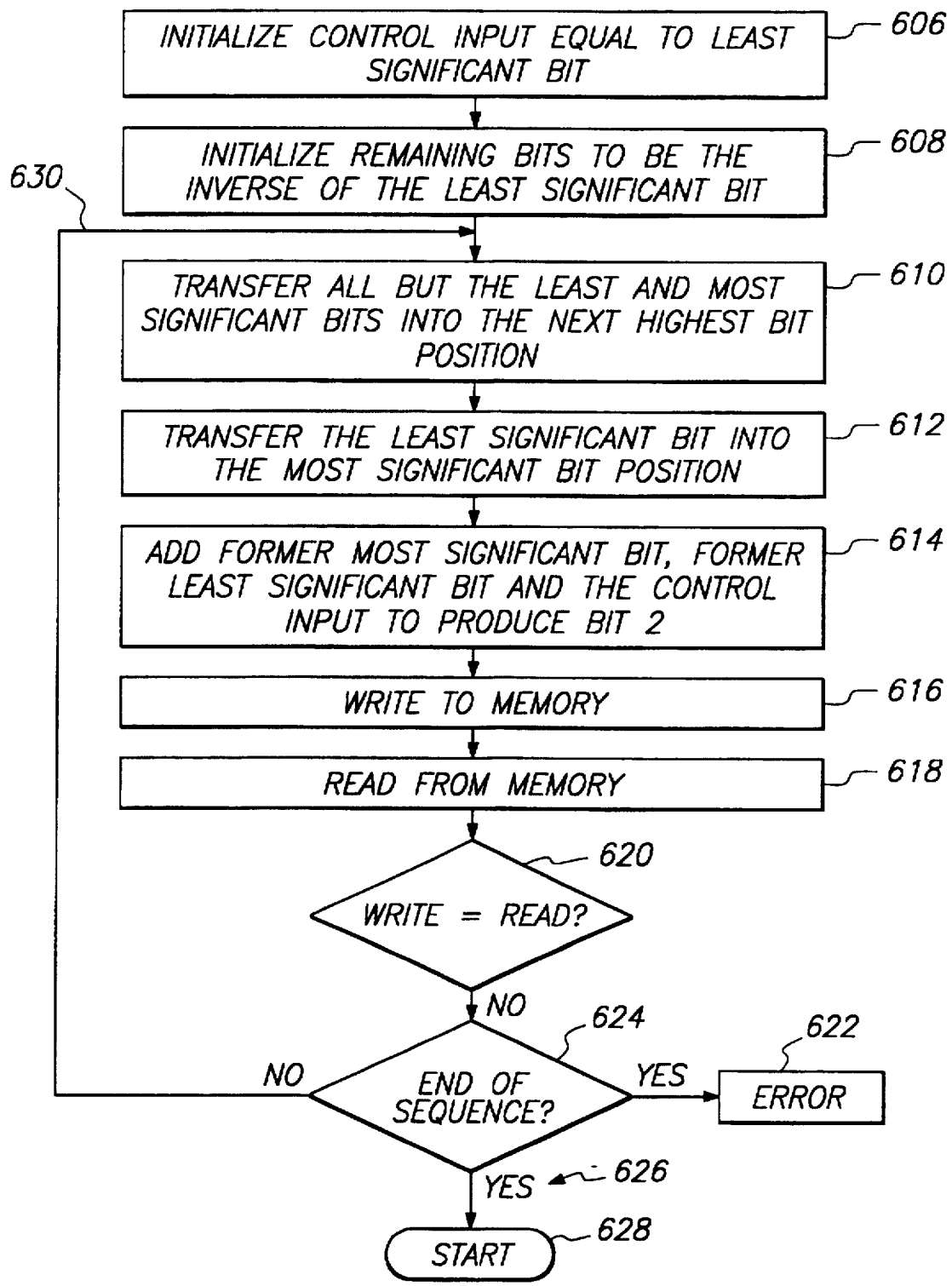
FIG. 6 is a flowchart showing a method according to the present invention.

Referring now to FIG. 6, one embodiment of the method of the present invention is shown for an N-bit word. The control input and least significant bit are initialized 606 to be equal and the remaining bits are initialized 608 to be the inverse of the least significant bit. The initialization steps 606, 608 may be performed in the reverse order. Bits 2 through N-1 are transferred 610 into the next highest bit position. The most significant bit is transferred 612 into the least significant bit. The former most significant bit, the former least significant bit and the control input are added 614 and the resulting low order sum bit is placed into bit position 2.

The resulting word is written 616 to the storage device under test, then read 618 and compared 620 with the word written. A difference between the two indicates a fault 622. After a fault the method may or may not continue. Where there is no fault or where there is a fault and the method continues after the fault, the resulting word is tested 624 for the end of the sequence. In one embodiment, the end of the sequenced is reached when the bits in the word are bit wise opposite from that of their initialization in steps 606, 608. If the end of the sequence is not reached 630 steps 610 through 624 may be repeated. If the end of the sequence is reached 618, the method of the present invention terminates 628 in one embodiment. In another embodiment, the method of the present invention may continue as if the end of the sequence 624 is never reached.

What is claimed is:

1. An apparatus for generating a sequence of binary numbers, the apparatus comprising:

a control input having a first state and a second state;

a plurality of apparatus outputs comprising a first apparatus output, a second apparatus output and a third apparatus output, the plurality of apparatus outputs being part of a first pattern of apparatus outputs in response to the control input having the first state and being part of a second pattern of apparatus outputs in response to the control input having the second state;

a plurality of storage modules coupled together and each having an input and an output having the first state and the second state, the plurality of storage modules having an order, each of the plurality of storage module outputs coupled to a different one of the plurality of apparatus outputs, the plurality of storage modules including a first storage module and including a last storage module, the input of the first storage module coupled to the output of the last storage module; and an adder having a first input coupled to the control input, a second input coupled to the output of a first select one of the plurality of storage modules, a third input coupled to the output of the last storage module, and an output coupled to the input of a second select one of the plurality of storage modules.

2. The apparatus of claim 1 wherein each storage module is a latch.

3. The apparatus of claim 1 additionally comprising a first apparatus input coupled to at least one of the plurality of storage modules for loading a first set of values in each of the plurality of storage modules.

4. The apparatus of claim 3 additionally comprising a second apparatus input coupled to at least one of the plurality of storage modules for loading a second set of values in each of the plurality of storage modules.

5. The apparatus of claim 4 additionally comprising a clock input coupled to at least one storage module.

6. The apparatus of claim 1 wherein a binary number comprises a most significant bit and a least significant bit and wherein:

the output of the first storage module corresponds to the most significant bit; and the output of the last storage module corresponds to the least significant bit.

7. A method of testing for faults in a storage module comprising first bit, a second bit and a third bit, the method comprising:

generating a first pattern;

storing the pattern in the storage module retrieving the pattern from the storage module;

comparing the pattern retrieved with the pattern generated;

responsive to the pattern retrieved not equal to the pattern generated, indicating the storage module contains a fault; and generating a second pattern by rotatably shifting at least two bits from the first pattern.

8. The method of claim 7 wherein the second pattern is generated by the additional steps of:

adding a control input and two bits in the first pattern to produce a sum comprising a most significant sum bit and a least significant sum bit; and replacing one of the bits in the first pattern with the least significant sum bit.

9. The method of claim 8 wherein the two bits added comprise the first bit and the third bit.

10. The method of claim 8 wherein the bit replaced in the first pattern is the first bit.

11. The method of claim 7 wherein the second pattern is generated by:

adding a control input and two bits in the first pattern to produce a sum comprising a least significant sum bit; and inserting the least significant sum bit into the second pattern.

12. The method of claim 11 wherein the two bits added comprise the first bit and the second bit.

13. The method of claim 12 wherein the sum bit is inserted into the second bit of the second pattern.

14. A system for testing a storage module having a plurality of inputs and a plurality of outputs, the system comprising:

a modified shift register comprising a plurality of latches coupled together and comprising an adder coupled between two of the plurality of latches, the adder including a control input having a first state and a second state and the modified shift register having a plurality of outputs coupled to the plurality of inputs of the storage module, the plurality of outputs of the modified shift register being part of a first pattern of modified shift register outputs in response to the control input being in the first state and being part of a second pattern of modified shift register outputs in response to the control input being in the second state; and an equality detector having a first set of a plurality of inputs coupled to the plurality of storage module outputs, a second set of a plurality of inputs coupled to receive the plurality of modified shift register outputs, and an output having a first state if the first set of equality detector inputs is equal to the second set of equality detector inputs and a second state if the first set of equality detector inputs is not equal to the second set of equality detector inputs.

* * * * *

UNITED STATES PATENT AND TRADEMARK OFFICE
CERTIFICATE OF CORRECTION

PATENT NO.: 5,781,562

DATED: July 14, 1998

INVENTOR(S): Nirmal R. Saxena

It is certified that an error appears in the above-identified patent and that said Letters Patent is hereby corrected as shown below:

Title page: Item [75]   , under Assignee, replace "Kawaski" with --Kawasaki--.

Signed and Sealed this

Twenty-fifth Day of April, 2000

*Attest:*

Q. TODD DICKINSON

*Attesting Officer*     *Director of Patents and Trademarks*